(12) United States Patent
Pollock et al.

(10) Patent No.: US 6,707,145 B2
(45) Date of Patent: Mar. 16, 2004

(54) EFFICIENT MULTIPLE POWER AND GROUND DISTRIBUTION OF SMT IC PACKAGES

(75) Inventors: Steven L. Pollock, Hillsboro, OR (US); Robert L. Olivier, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/753,303

(22) Filed: Dec. 29, 2000

(65) Prior Publication Data

US 2002/0084533 A1 Jul. 4, 2002

(51) Int. Cl.[7] ............................................. H01L 23/52
(52) U.S. Cl. ........................ 257/691; 257/684; 257/700; 257/786; 257/778
(58) Field of Search ........................ 257/684, 691, 257/700, 785, 786, 778

(56) References Cited

U.S. PATENT DOCUMENTS

| | | | | |
|---|---|---|---|---|
| 5,036,163 A | * | 7/1991 | Spielberger et al. | 174/52.4 |
| 5,456,004 A | * | 10/1995 | Swamy | 29/852 |
| 5,483,099 A | * | 1/1996 | Natarajan et al. | 257/691 |
| 5,509,200 A | * | 4/1996 | Frankeny et al. | 29/852 |
| 5,786,986 A | * | 7/1998 | Bregman et al. | 361/719 |
| 5,864,470 A | * | 1/1999 | Shim et al. | 361/777 |
| 5,889,325 A | * | 3/1999 | Uchida et al. | 257/724 |
| 5,895,967 A | * | 4/1999 | Stearns et al. | 257/691 |
| 5,903,050 A | * | 5/1999 | Thurairajaratnam et al. | 257/695 |
| 6,020,637 A | * | 2/2000 | Karnezos | 257/738 |
| 6,075,285 A | * | 6/2000 | Taylor et al. | 257/691 |
| 6,081,026 A | * | 6/2000 | Wang et al. | 257/700 |
| 6,219,910 B1 | * | 4/2001 | Murali | 29/840 |
| 6,316,828 B1 | * | 11/2001 | Tao et al. | 257/723 |
| 6,362,525 B1 | * | 3/2002 | Rahim | 257/738 |

FOREIGN PATENT DOCUMENTS

JP  4/11/031756  * 2/1999  ........... H01L/23/12

* cited by examiner

Primary Examiner—George Eckert
(74) Attorney, Agent, or Firm—Blakely, Sokoloff, Taylor & Zafman LLP (57) ABSTRACT

An apparatus, comprising a substrate having a surface, comprising an array of electrical contacts, and a plurality of electrical planes, where the plurality of electrical planes are positioned within the electrical contact array.

6 Claims, 7 Drawing Sheets

EFFICIENT MULTIPLE POWER AND GROUND DISTRIBUTION OF SMT IC PACKAGES

FIELD OF THE INVENTION

This invention relates to the field of managing power and ground connections between a microchip-substrate and a second substrate and in particular to constructing power and ground planes within solder ball and solder land arrays.

DISCUSSION OF RELATED ART

The ever-increasing density improvements in silicon can be more fully exploited with corresponding wiring density improvements in chip carriers. Challenges to increased wire density have been met with ball grid array packaging designs. However, as the number of balls have increased such as with C4 flip-chip designs, so has the inductance. In addition, the need for a via for each ball has increased the difficulty of routing circuitry around the additional vias. In current ball grid array designs typically one half of the balls are associated with power or ground connections. As linewidths are reduced, inductance and routing problems will continue to become more severe.

BRIEF DESCRIPTION OF THE DRAWINGS

FIGS. 2A–2G illustrate processing of an electric plane on the die-substrate;

FIGS. 3A–3E illustrate processing of an electrical plane on a PCB substrate;

DETAILED DESCRIPTION OF THE PRESENT INVENTION

A structure and method for providing power and ground planes (strips) within an array of electrical contacts on mating substrates is disclosed. The array of electrical contacts could be in the form of solder balls and solder lands. The structure and method will provide an efficient means of connecting power and ground between a microchip (die) substrate and a second substrate. The power and ground planes can be located on each substrate with the solder ball array or solder land array surrounding. This structure and method allows for the placement of signal in more of the electrical contacts in the array (solder balls—solder lands) as a result of reducing or eliminating the number of solder balls and solder lands devoted to ground and power. In addition, by placing the signal contacts outside the power and ground strip perimeters, routing from the solder balls and solder lands can be made easier.

Placing the power planes and ground planes in the center of the solder ball—solder land (electrical contacts) arrays may not cost any solder ball—solder land locations as the center area is typically hollow, i.e. not used for solder ball—solder land placement. As a result, the power and ground contacts can be substantially or entirely removed from the array, which will allow for an increase in the total number of signal electrical contacts. The increase in the total number of signal electrical contacts is possible even with increased spacing that may be required between signal balls to deal with increased potential for ground bounce, crosstalk, and voltage ripple resulting from the removal of the individually placed ground and power balls from the array.

At assembly, the solder balls on the die-substrate can mate with solder lands on a second substrate such as a printed circuit board (PCB). The die-substrate may be in the form of a ball grid array (BGA) package or may use newer designs such as C4 flip-chip technology. The present invention will place one or more ground planes and one or more power planes on the surface of the second substrate to mate with equivalent ground planes and power planes on the die-substrate. The power planes and ground planes may be centered within the array of electrical contacts, i.e. the solder balls and solder lands. The power planes and ground planes may take on any shape from square to a number of linear strips to circular or spiral. Two or more of the power and/or ground planes may be concentric. To improve routing for the signal connections of the solder balls and solder lands, the power and ground planes can be centered within the array of electrical contacts on each substrate.

In the following description numerous specific details are set forth such as specific materials, equipment, and processes in order to provide a thorough understanding of the present invention. In other instances, well known computer assembly techniques and machinery have not been set forth in detail in order to minimize obscuring the present invention.

Figure 1A:
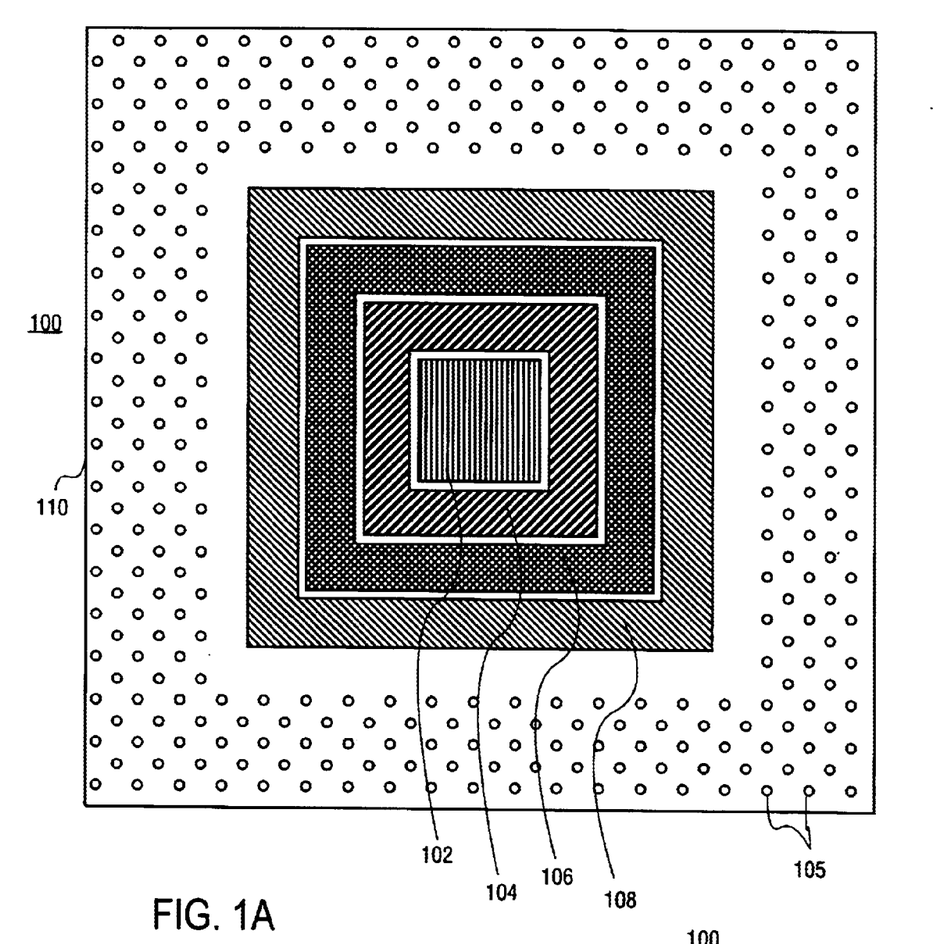
FIG. 1A is an illustration of a bottom view of a die-substrate having solder balls and power and ground planes.
Figure 1B:
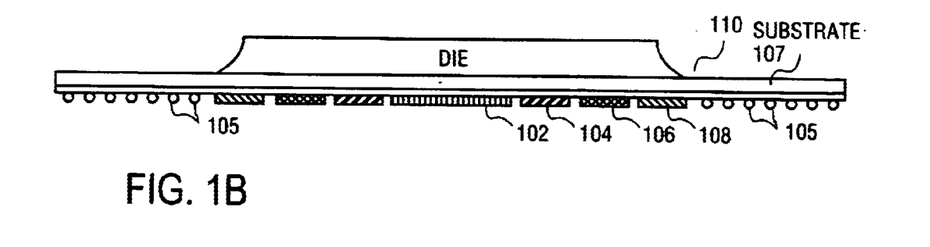
FIG. 1B is an illustration of a cross-section of the die-substrate.

FIGS. 1A & 1B illustrate an embodiment of a die-substrate 100 having a square shaped ground plane 102 and several square shaped power planes 104, 106, 108. The ground plane 102 and power planes 104, 106, 108 are constructed of copper and coated with a thin layer of solder (not shown). The present invention will deposit onto the die-substrate 100, one or more ground planes 102 and one or more power planes 104, centered within the array of electrical contacts, here solder balls 105. The present invention will make use of solder masking 107 to connect the power planes 104, 106, 108 and ground planes 102 with vias (not shown) to routing (not shown) in the same manner as is accomplished for the solder balls 105.

The assembly process can attach the die-substrate to a second substrate such as a printed circuit board (not shown)

where the printed circuit board can contain "mirrored" equivalent ground and power plane areas to mate with the ground and power plane areas on the die-substrate. A further benefit of the copper power and ground strips on the die-substrate, mating to approximately equivalent surface areas of power and ground strips on the PCB, is that a rate of heat transfer from the die can be increased.

Figure 2A:
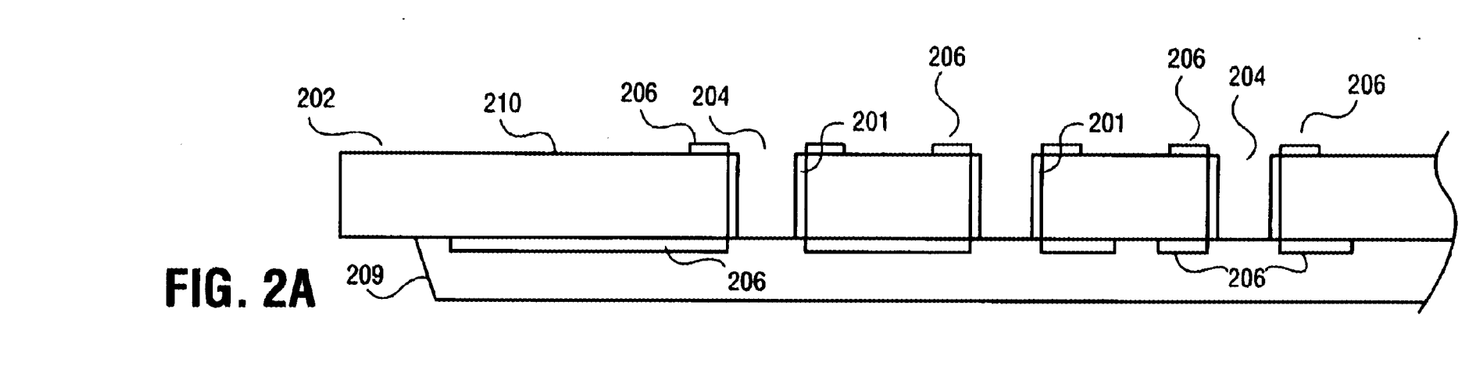
FIG. 2A is an illustration of a die-substrate with via openings.
Figure 2B:
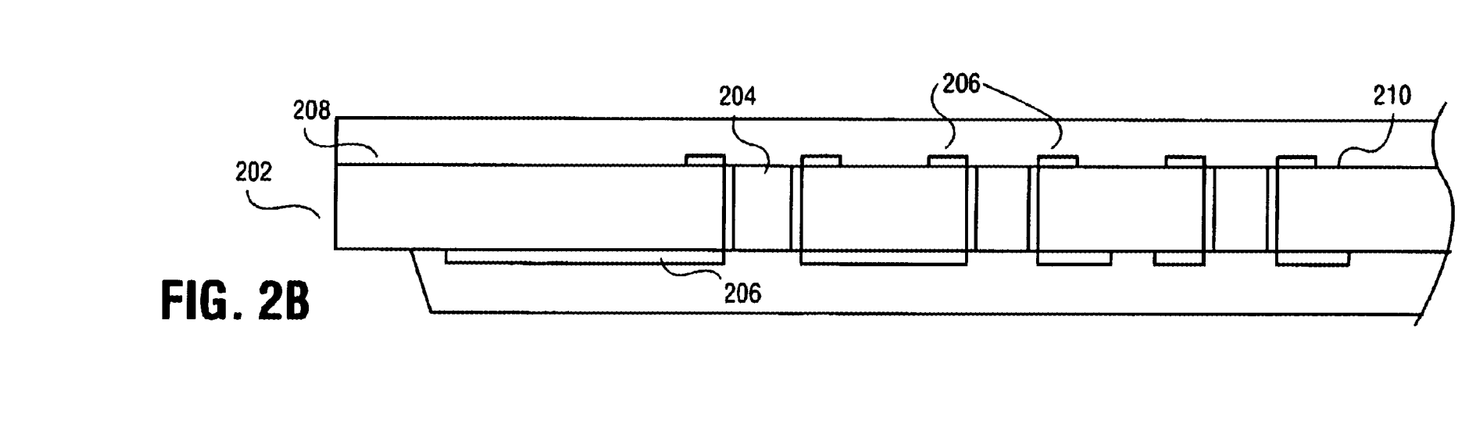
FIG. 2B is an illustration of the die-substrate with a solder mask.
Figure 2C:
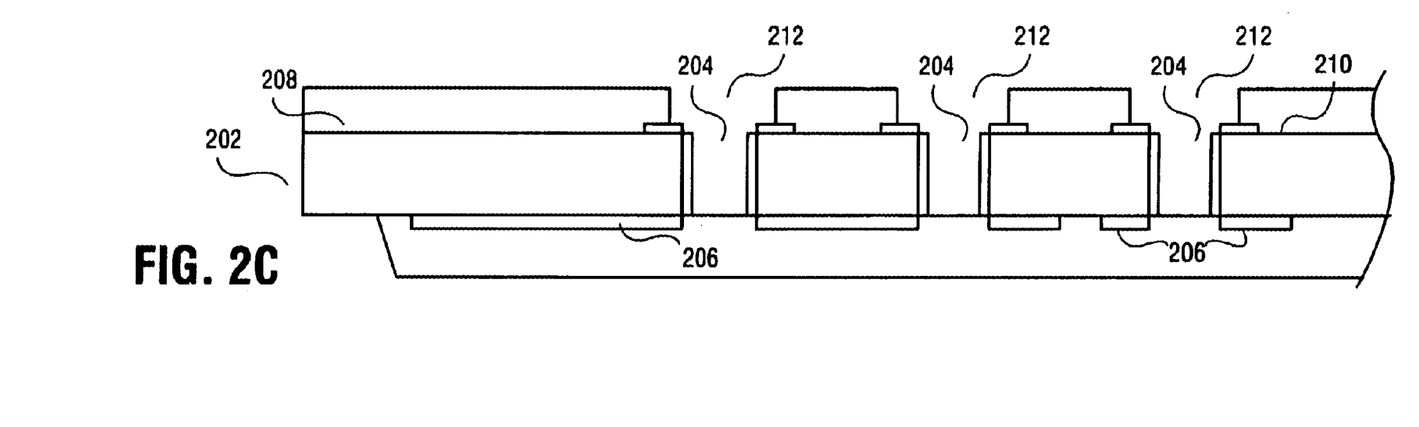
FIG. 2C is an illustration of the die-substrate with vias exposed within the solder mask.
Figure 2D:
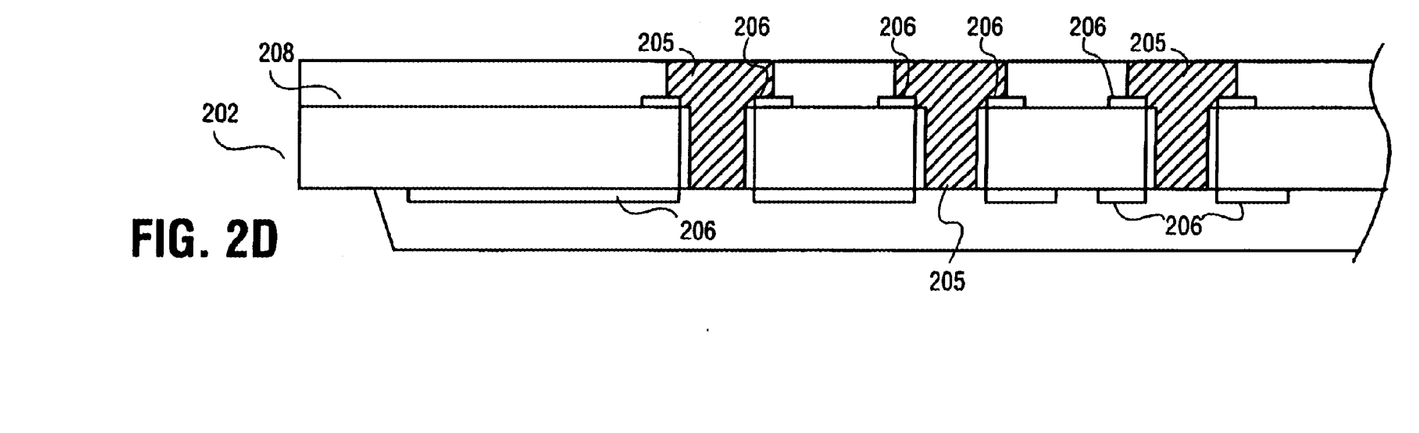
FIG. 2D is an illustration of the die-substrate with solder filled vias.
Figure 2E:
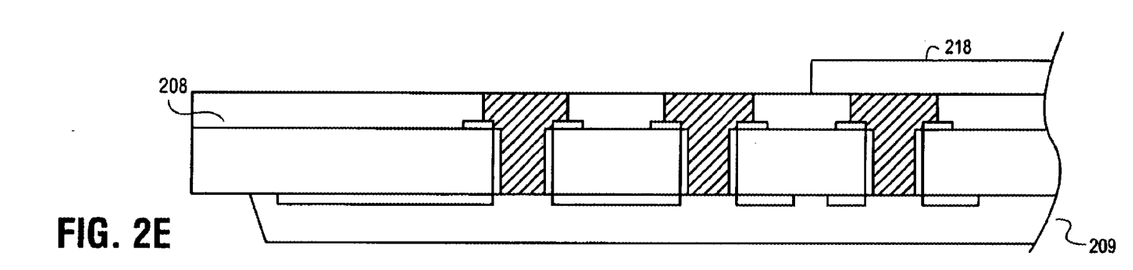
FIG. 2E is an illustration of the die-substrate with an electrical plane deposited.
Figure 2F:
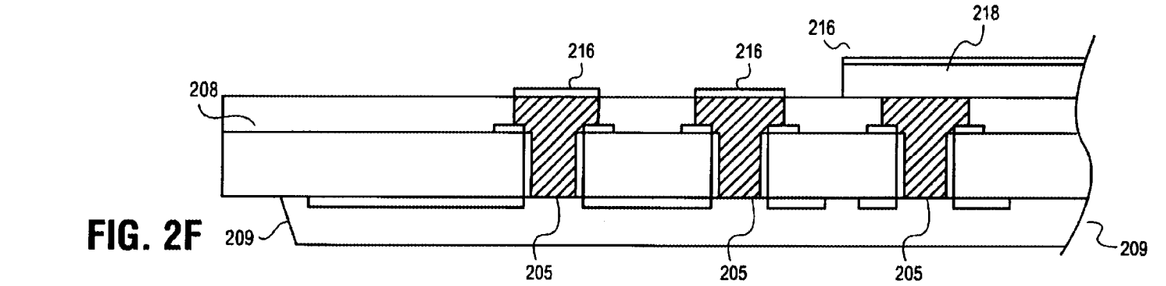
FIG. 2F is an illustration of the die-substrate with a second coating of solder.
Figure 2G:
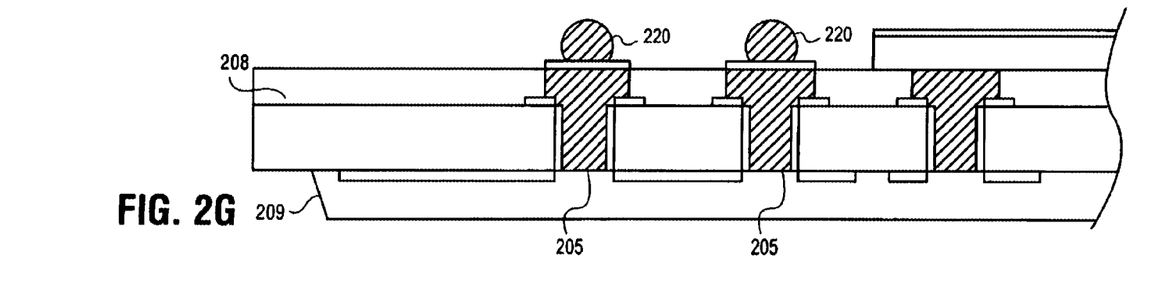
FIG. 2G is an illustration of the die-substrate with the addition of solder balls.
Figure 4:
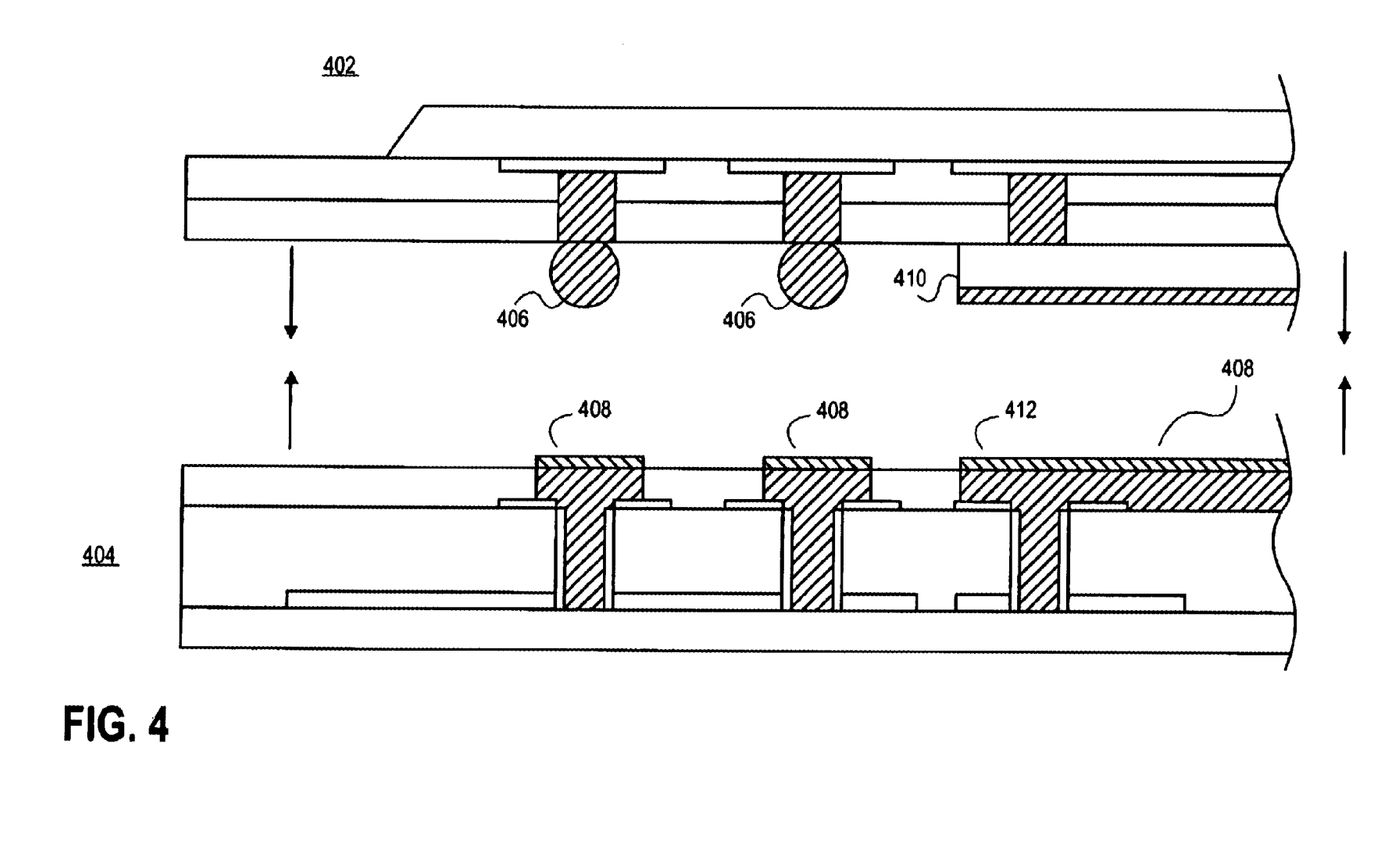
FIG. 4 is an illustration of an assembly of a die-substrate to a PCB substrate.

FIGS. 2A–2E illustrate an embodiment where a series of fabrication steps construct a power or ground strip on a die-substrate where the die is contained within a BGA package (BGA substrate). Only one power/ground strip is shown in these Figures, however this process may produce any number of power strips and/or ground strips. FIG. 2A illustrates a BGA substrate 202 containing a number of via holes 204 having a coating 201 made up of solder over a copper lining. The via holes 204 connect to copper traces 206 on the BGA substrate 202. Copper traces 206 may exist in layers and the layers can exist on either side of the BGA substrate 202. The copper traces 206 can constitute circuitry or routing to electrical circuitry. The BGA substrate 202 has a plastic package 209 attached on one side that can contain a die (not shown). FIG. 2B illustrates a solder mask 208 blanket deposited over the substrate surface 210. The solder mask can protect the copper traces 206 from oxidation. As illustrated in FIG. 2C, after patterning such as with the photoresist process and a subsequent etch, holes 212 are opened in the solder mask 208 exposing the vias 204 where solder balls, power planes and ground planes will later be placed. FIG. 2D illustrates the results of a solder wave operation where the substrate 202 is processed through a solder wave machine that coats the solder mask 208 with solder 205. The solder 205 will not attach to solder mask material 208 but can fill the via openings 205. FIG. 2E illustrates the results of a copper plating operation to construct the power or ground plane 218. The plating operation may first use a photoresist coating (not shown) that is exposed to a pattern and the non-exposed photoresist coating removed with a solvent. The removed photoresist areas can then be plated with copper to a desired thickness to construct power and/or ground planes 218. The thickness of the copper plated could be such that after application of the solder balls (not shown) and a tacky solder coating (FIG. 2F below), the height of the copper ground/power plane is approximately equal to that of the solder ball heights (FIG. 4 below). FIG. 2F illustrates an additional solder wave operation where a thin layer of solder 206 is applied to the tops of the filled vias 205 and the copper power/ground plane 218. The additional solder layer 216 has a tacky viscosity that allows contact to be maintained between solder balls and the solder pads on a printed circuit board substrate (not shown) until a reflow operation is complete. FIG. 2G illustrates the addition of the solder balls 220 over filled vias 205.

Figure 3A:
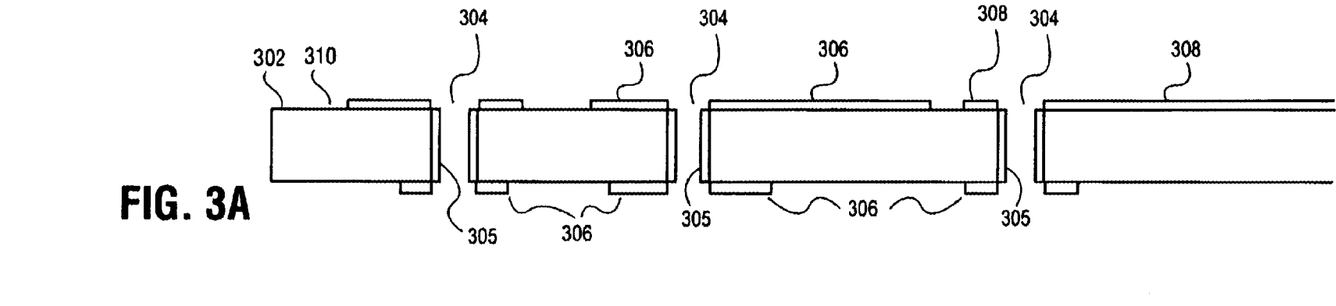
FIG. 3A is an illustration of a PCB substrate with via openings.
Figure 3B:
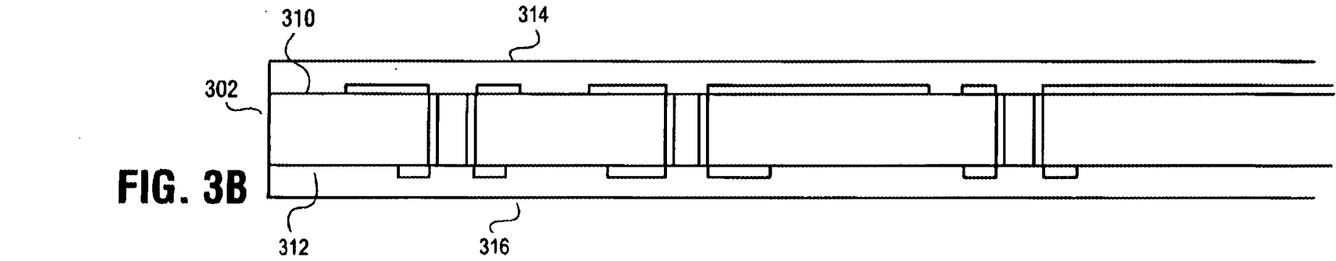
FIG. 3B is an illustration of the PCB substrate with solder masks.
Figure 3C:
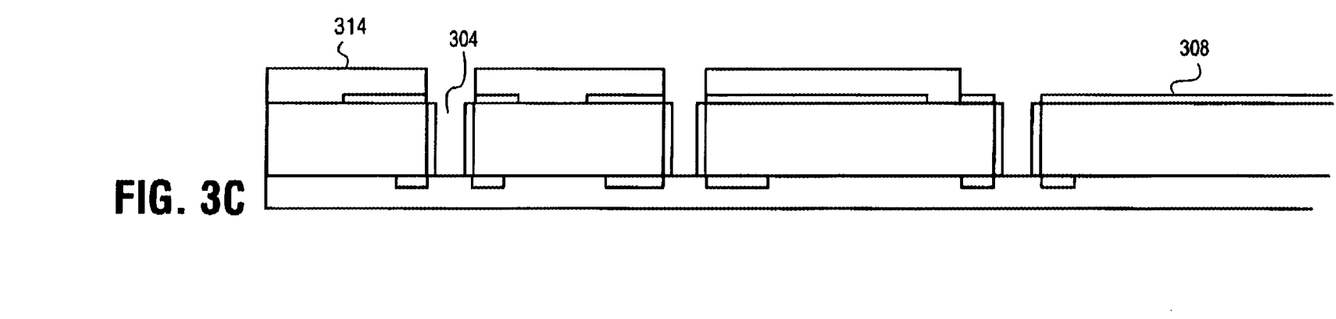
FIG. 3C is an illustration of the PCB substrate with openings in the solder mask.
Figure 3D:
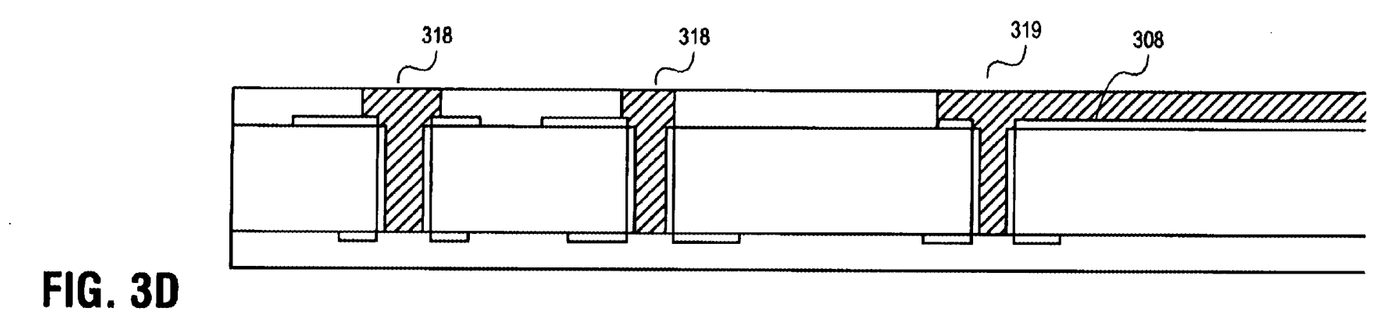
FIG. 3D is an illustration of the PCB substrate with solder filled vias and solder covering an electrical plane.
Figure 3E:
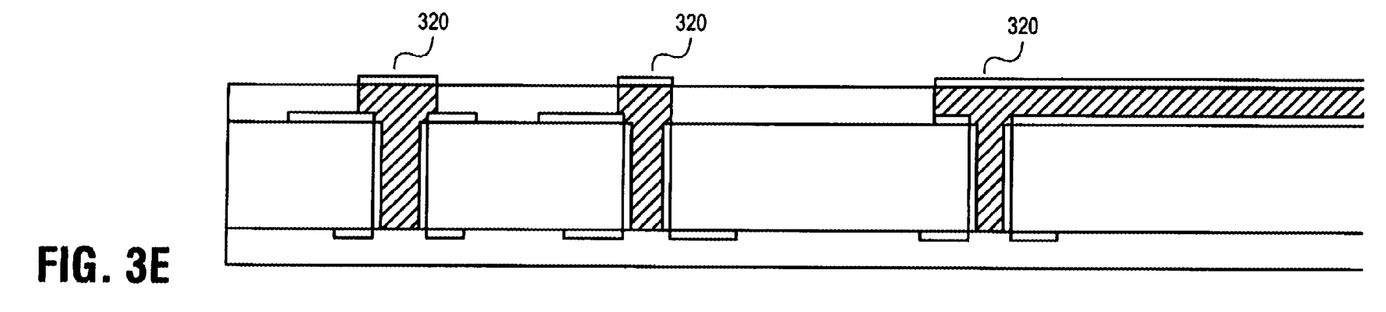
FIG. 3E is an illustration of the PCB substrate with a second solder coating.

FIGS. 3A–E illustrate an embodiment of a process for fabricating power and ground strips on a mating substrate such as the printed circuit board. FIG. 3A illustrates the PCB substrate 302 having via holes 304 coated with copper/solder 305 where the via holes 304 connect to copper traces 306 positioned on several layers. The copper traces 306 have been produced from copper layers (not shown) on the PCB substrate 302. The copper layers were coated with a photoresist (not shown), the coating light exposed to a pattern, and the unreacted portion of photoresist coating removed with a solvent. The copper exposed in the photoresist pattern is etched and remaining are the copper traces 306 that can constitute routing circuitry and in this embodiment copper remains to form the power or ground plane 308. FIG. 3B illustrates the addition of a first solder mask coating 314 on the PCB substrate side 310 having the power or ground plane 308 and a second solder mask coating 314 on the opposite side 312. The solder masks 314 and 316 protect the copper traces 306 from oxidation and the second solder mask 316 acts to plug some or all via openings to stop solder from flowing out in later processing operations. FIG. 3C illustrates the first solder mask 314 after patterning with a photoresist process. Openings in the first solder mask 314 are created over the via openings 304 and the power/ground strip 308. FIG. 3D illustrates the results of a solder wave operation where the via openings 304 are filled with solder 318 and the opening over the power/ground strip 308 is filled with solder 319. FIG. 3E illustrates the deposit of a tacky solder layer 320 over the solder filling the vias 318 and the solder coating the power/ground strip 319.

FIG. 4 illustrates the assembly of the BGA substrate 402 with the PCB substrate 404. The BGA substrate 402 and the PCB substrate 404 are positioned to contact the solder balls 406 with the solder lands 408, and the mating ground/power planes 410 and 412. Next, a heating cycle is performed by placing the BGA substrate 402/PCB substrate 404 assembly in a reflow oven that heats the solder until it flows as a liquid. After the reflow operation, the solder balls 406 are electrically and mechanically connected to the solder lands 408 and the power/ground planes 410 of the BGA substrate 402 are electrically and mechanically connected to the mating power/ground planes 412 on the PCB substrate 404.

During production, printed circuit board substrates and die-package substrates may be passed through a soldering apparatus where one side is subjected to a soldering operation to solder hundreds of terminals on each of the boards/substrates. The use of wave soldering machines for this purpose is well known. These machines include conveyors that carry the boards over a molten bath of solder that is agitated to rise in waves against the undersides of the boards. Prior to wave soldering, a solder masking operation is required to protect portions of the PCB/die-package substrates from being contacted by the hot molten solder. The solder mask is applied as one or more coatings through well-known techniques such as sputter, spray, or silk-screen such as through a steel screen mesh. When the solder mask is applied with a screen mesh, a pattern in the mesh can provide openings in the solder mask to be later filled with the solder operation. After cure of the solder masking, wave soldering is performed to fill-in the areas open in the mask. The cured solder mask remains on the finished substrate providing good dielectric coverage for the circuit lines to be protected.

We claim:

1. An assembly, comprising:
a die-substrate having a plurality of electrical planes formed thereon, each electrical plane of the die-substrate coated with a relatively thin layer of solder;
a second substrate having a plurality of electrical planes formed thereon, each electrical plane of the second substrate coated with a relatively thin layer of solder; assembled such that upon undergoing a heating process, the plurality of electrical planes on the die-substrate are electrically and mechanically connected to the plurality of electrical planes on the second substrate, the connected electrical planes centered within an array of electrical contacts.

2. The assembly of claim 1, wherein at least one of the plurality of connected electrical planes connects to power.

3. The assembly of claim 2, wherein at least one of the plurality of connected electrical planes connects to ground.

4. The apparatus of claim 1, wherein the die-substrate is a C4 flip-chip.

5. The apparatus of claim 4, wherein the die-substrate is an OLGA material package.

6. The apparatus of claim 1, wherein the die-substrate is a BGA package.

* * * * *